United States Patent [19]

Fischer

[11] 3,940,700

[45] Feb. 24, 1976

[54] METHOD AND INSTALLATION FOR THE DETECTION OF A SOURCE GENERATING ELECTRO-MAGNETIC OSCILLATIONS

[75] Inventor: Markus Fischer, Bern, Switzerland

[73] Assignee: Paul Haas, Bern, Switzerland

[22] Filed: Aug. 10, 1973

[21] Appl. No.: 387,454

[30] Foreign Application Priority Data

Aug. 15, 1972 Switzerland.................. 12079/72

[52] U.S. Cl. .................. 325/363; 324/47; 325/67; 325/364; 325/367; 325/370; 340/185; 340/258 D; 343/112 R; 343/112 D; 343/205

[51] Int. Cl.² ............................................ H04B 1/16

[58] Field of Search ........... 325/29, 31, 54, 67, 133, 325/363, 364, 366, 367, 370, 302, 470; 340/164, 224, 312, 258 C, 258 D, 185, 189; 179/82; 343/112 D, 112 R, 113 R, 119, 123, 205; 324/47

[56] References Cited
UNITED STATES PATENTS

| | | | |
|---|---|---|---|
| 2,490,777 | 12/1949 | Bryant et al. ................ | 343/112 D |
| 2,519,521 | 8/1950 | Weighton .................... | 343/112 D |
| 3,097,358 | 7/1963 | Zamanakos .................. | 343/119 |
| 3,134,104 | 5/1964 | Murphree et al. .............. | 343/112 D |
| 3,466,652 | 9/1969 | Heyser ....................... | 325/67 |
| 3,470,481 | 9/1969 | Myers et al. ................. | 325/470 |

Primary Examiner—Howard W. Britton
Assistant Examiner—Marc E. Bookbinder
Attorney, Agent, or Firm—Werner W. Kleeman

[57] ABSTRACT

A method for the detection of a source generating electro-magnetic oscillations wherein for the purpose of eliminating disturbances caused by foreign transmitters there is measured the field intensity at at least two spatially separate locations, the determined measurement values are compared with one another, and when the difference of both measurement values exceeds a value or amount dependent upon the spacing between the measurement locations there is triggered an alarm signal.

The installation for the performance of the aforesaid method comprises a receiver and a first antenna and a second antenna. An antenna reversing switch may be provided for connecting the receiver into circuit with the one or the other antenna. An alternate embodiment provides a second receiver, wherein each antenna is connected with one of the receivers. A comparator serves to compare the signals generated in the receiver or receivers and which signals are dependent upon the fields acting upon the antennae. An evaluation device generates an alarm signal when the difference of the signals determined with the aid of both antennae exceeds a predetermined value.

14 Claims, 4 Drawing Figures

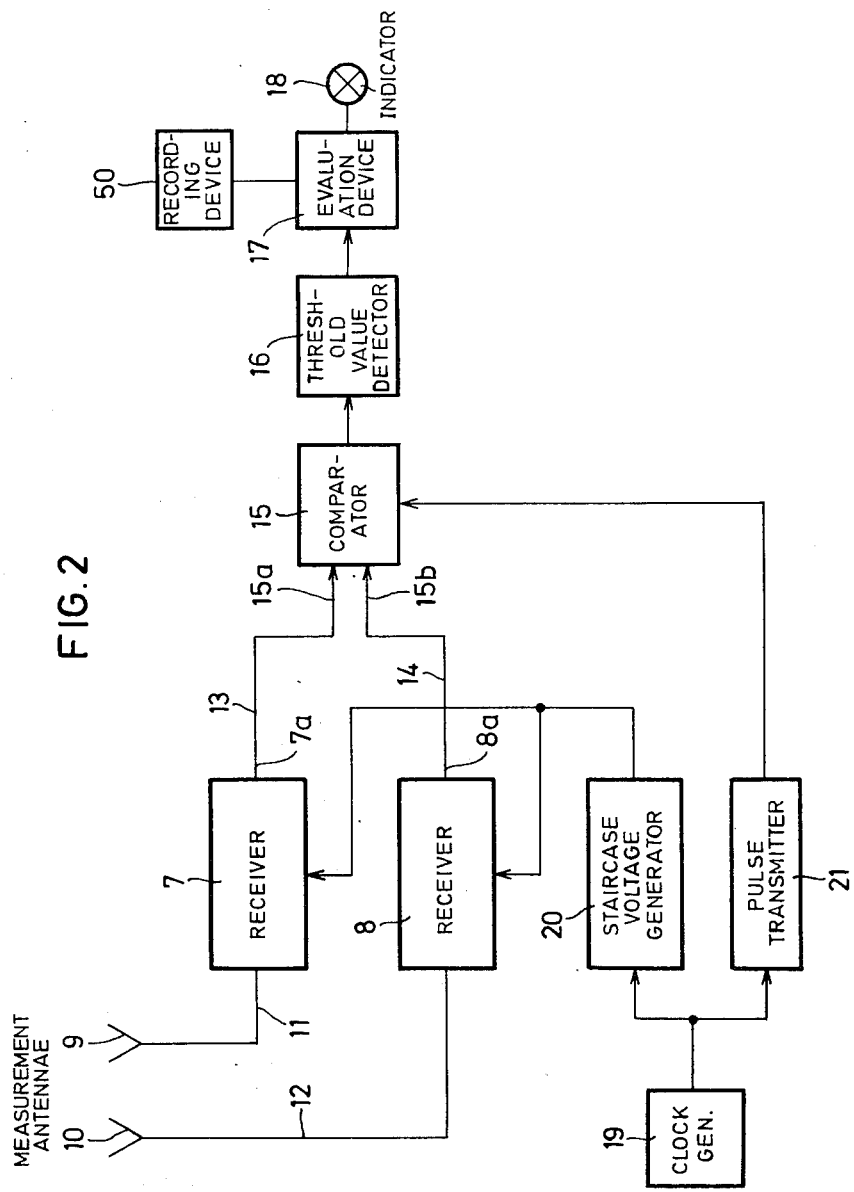

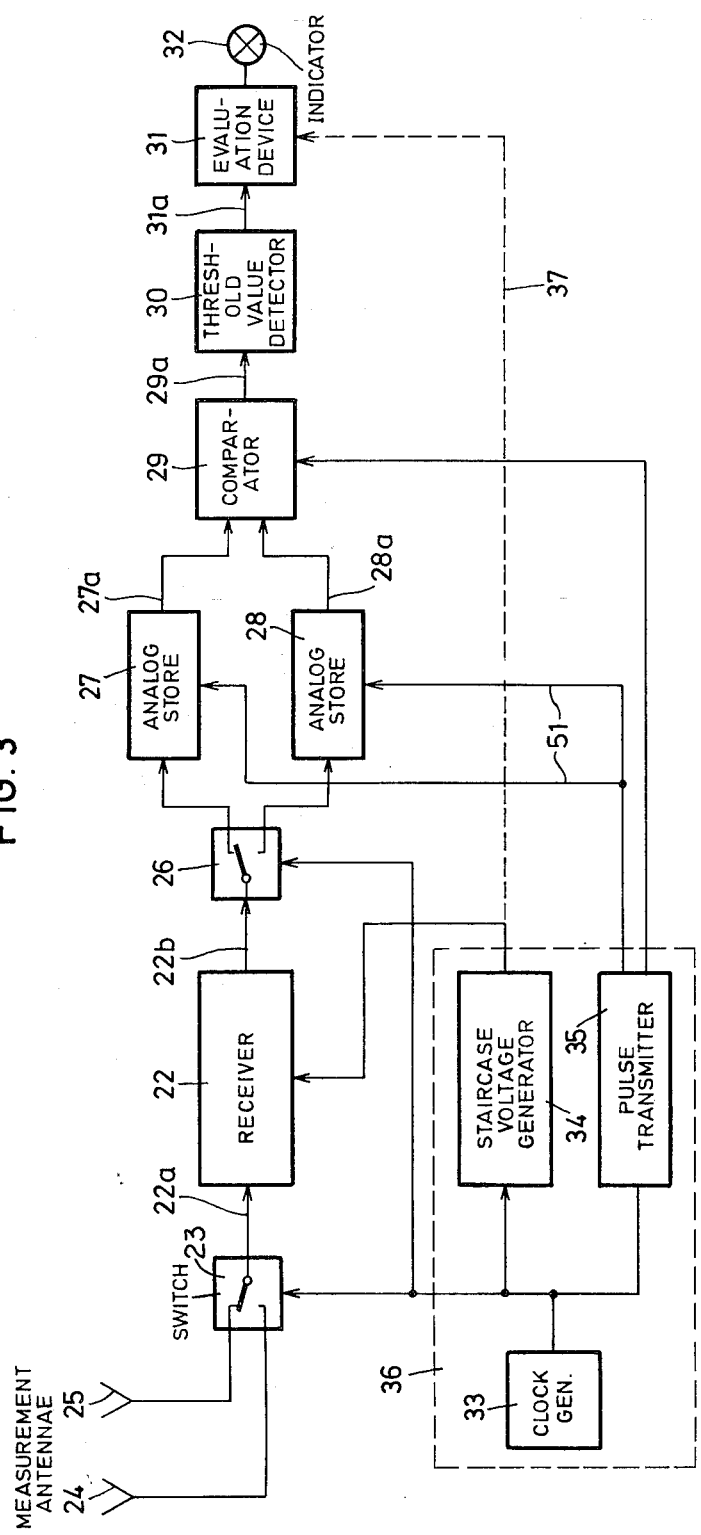

METHOD AND INSTALLATION FOR THE DETECTION OF A SOURCE GENERATING ELECTRO-MAGNETIC OSCILLATIONS

BACKGROUND OF THE INVENTION

The present invention relates to a new and improved method for the detection or recognition of a source generating electro-magnetic oscillations or energy and an apparatus for carrying out the aforesaid method.

Unfortunately, attempts are repeatedly undertaken by unauthorized persons by using a small transmitter, so-called miniature spy devices, to obtain illegal knowledge of conversations undertaken between individuals on a private or confidential basis. Oftentimes these miniature spy devices are transmitters which of necessity can only transmit a very small output, the range of which extends from a few meters up to several kilometers. The detection of such miniature transmitters by the eye is almost impossible within any useful period of time since the dimensions of such small transmitters, owing to the modern miniaturization techniques which are available, are so small that it is readily possible to construct the external form of such transmitters similar to objects which are in general use and conventionally employed, so that the possibility of effectively camouflaging these illegal miniature transmitters is extremely great.

It has already been proposed to search for the possibly concealed miniature transmitter by means of a wide band receiver having a search antenna, in that there is searched the area where one suspects there is located the miniature transmitter. In the event that there are not present any or only weak electro-magnetic fields emanating from other legal transmitters, for instance radio transmitters, then it is possible with such type receiver to find the hidden miniature transmitter with relatively little expenditure. However, if there are present electrical fields which emanate from legal transmitters — which is normally the case — then the sensitivity of the aforementioned receiver must be so markedly reduced that locating the illegal transmitter is rendered considerably more difficult.

Furthermore, there is known in this particular field of technology the so-called feedback technique. In this case there is employed a receiver having a loud speaker, this receiver being tuned over the frequency range which is to be controlled. If the frequency set at the receiver coincides with that of the miniature transmitter which is to be located, than there appears via the loud speaker of the receiver and the listening microphone of the miniature transmitter an acoustical feedback which is perceivable in the form of a whistling tone. Since the receiver employed with this technique is very selective, it can possess really good sensitivity. Yet, a considerable drawback of this technique resides in the fact that there is required an active cooperative action of the miniature transmitter which is to be located. This cooperative action can be, however, prevented at the miniature transmitter by carrying out certain circuit designs so as to foil this type of detection, with the result that also this technique has produced rather unsatisfactory results.

SUMMARY OF THE INVENTION

Hence, it is a primary object of the present invention to provide an improved method and installation for the recognition of a source generating electro-magnetic oscillations in a manner not associated with the aforementioned drawbacks and limitations of the prior art proposals.

Another and more specific object of the present invention relates to a new and improved method of, and installation for, enabling the detection of the presence of a source of electro-magnetic oscillations when such source is in operation, independent of the fact that electro-magnetic fields may be present or not from other transmitters.

Still another object of the invention is to provide a method of an apparatus for recognizing the presence of a nearby source of electromagnetic energy within a building independently of the presence of electromagnetic energy emanating from more distant interfering transmitters located externally of the building.

Yet a further significant object of the present invention relates to an improved method of, and installation for, detecting electro-magnetic energy emanating from a source, in an extremely reliable, accurate and rapid manner and capable of reliably discriminating between electro-magnetic energy emanating from proper and improper sources.

Now in order to implement these and still further objects of the invention, which will become more readily apparent as the description proceeds, the method aspects of this development are manifested by the features that for the purpose of eliminating disturbances caused by foreign transmitters, there is measured the field intensity at least at two spatially separate locations, the determined measurement values are compared with one another, and upon the difference of both measurement values exceeding a value which depends upon the spacing or distance between the measurement locations there is triggered an alarm signal.

As explained above, the invention is not only concerned with the aforementioned method aspects, but also relates to an improved construction of installation for the performance thereof which is of the type comprising a receiver and a first antenna and a further antenna. An antenna reversing switch serves for connecting the receiver with the one or the other antenna. As an alternate embodiment there may be provided a second receiver, each antenna being connected with one of the receivers. A comparator serves to compare the signals generated in the receiver or receivers and which are dependent upon the magnetic fields acting upon the anntenae. An evaluation device produces an alarm signal when the difference of the signals determined with the aid of both antennae exceeds a predetermined value.

BRIEF DESCRIPTION OF THE DRAWINGS

The invention will be better understood and objects other than those set forth above, will become apparent when consideration is given to the following detailed description thereof. Such description makes reference to the annexed drawings wherein:

FIG. 2 is a block circuit diagram of a first embodiment of installation from the recognition of an unknown source of electro-magnetic oscillations;

FIG. 3 is a block circuit diagram of a second embodiment of installation for the recognition of an unknown source of electro-magnetic oscillations.

DETAILED DESCRIPTION OF THE PREFERRED EMBODIMENTS

Figure 1:
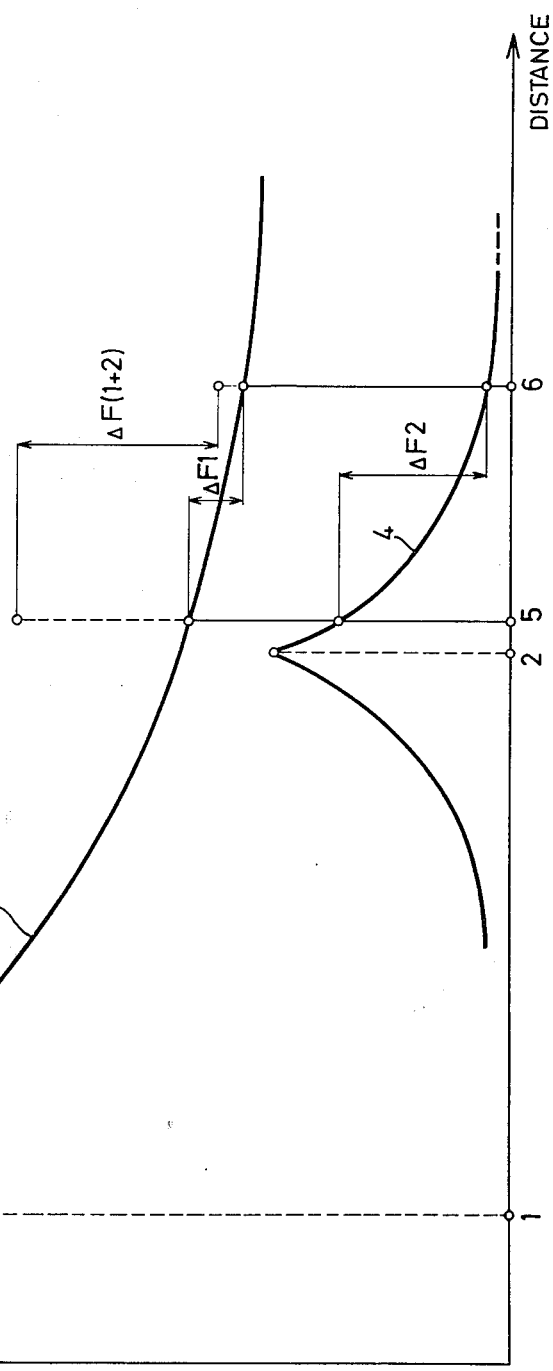
FIG. 1 is a graphic representation of the course of the field intensity of two transmitters as a function of distance.

Describing now the drawings, FIG. 1 graphically portrays the course of the field intensity of a legal transmitter and a transmitter which is much weaker in comparison thereto as a function of the distance of the relevant locations of such transmitters. The location of the legal transmitter has been indicated along the abscissa of the graph by reference character 1 and the location of the weaker transmitter by reference character 2. The curve 3 portrays the course of the field intensity of the legal transmitter and the curve 4 portrays the course of the field intensity of the weaker transmitter.

Reference characters 5 and 6 respectively designate the location of two measurement antennae. The decrease of the field intensity as a function of the distance between the measurement location and the physical location of the transmitter occurs for both transmitters according to the same scientific laws, and specifically generally stated for each doubling of the distance the field intensity decreases at least by the factor of four. The difference $\Delta F1$ between the field intensities measured at the locations 5 and 6 of the measurement antennae according to the curve 3 is considerably smaller than the difference $\Delta F2$ between the field intensities measured at the same locations 5 and 6 of the measurement antennae according to the curve 4. Even if the weaker transmitter at the location 2 transmits with the same frequency as the transmitter at the location 1, with the result that there is a superimposing of such field intensities, nonetheless the weaker transmitter can be detected by virtue of the larger difference $\Delta F(1+2)$.

The exemplary embodiments of installation for the recognition or detection of sources of electro-magnetic oscillations or energy function in accordance with the above-discussed principles.

Now in FIG. 2 there has been illustrated a block circuit diagram of a first exemplary embodiment of installation useful for the performance of the method aspects of this development. This apparatus or installation possesses two receivers 7 and 8 each of which has fixedly associated therewith a respective measurement antenna 9 and 10. The measurement antenna 9 and 10 preferably exhibit omni-directional characteristics. One of these measurement antennae is erected at the region of the suspected miniature transmitter, i.e., at the room or area in which the confidential discussions are to take place. The other measurement antenna is erected externally of this room or area, for instance at the roof of the building. The receivers 7 and 8 as well as the further components of the installation can be erected at a location suitable for this purpose. In so doing, care is to be taken to insure that the sensitivity of both receivers is adjusted to be at least approximately equal, and there is to be taken into particular account the different lengths of the antenna cables 11 and 12.

The outputs 7a and 8a of the recievers 7 and 8 respectively are electrically coupled via a respective conductor or line 13 and 14 with a respective input 15a and 15b of a comparator 15. There is delivered from each receiver 7 and 8 to the comparator 15 a signal which is dependent upon the field intensity prevailing at the associated measurement antenna. In this comparator 15 both of the signals are compared with one another and the comparator generates an output signal which is dependent upon difference of both of these signals. This output signal is delivered to a threshold value detector or monitor 16. The threshold value detector 16 delivers a trigger signal to an evaluation device 17 when the output signal of the comparator 15 exceeds a predetermined value.

In the simplest situation, the evaluation device 17 produces an alarm signal which is delivered to an indicator device, such as the indicator lamp 18. Furthermore, there can be coupled with the evaluation device 17 the schematically illustrated recording device 50 which, for instance, records the moment when the miniature transmitter which is to be detected begins its transmitting function.

Since normally it is not known at which wave length the miniature transmitter to be detected is operating the receivers 7 and 8 are tuned over a wide frequency range. The setting of the receiving frequency can occur continuously or stepwise. For this purpose there is provided a clock generator 19 which, on the one hand, controls a staircase voltage generator 20, and, on the other hand, controls a pulse transmitter 21. The staircase waveform output voltage of the staircase voltage generator 20 is delivered to the receivers 7 and 8, so that the receivers scan in synchronism and in stepwise fashion the frequency band which is to be monitored. The size of the individual increments or steps, through which the tuning of both receivers 7 and 8 is to be simultaneously varied, at most is equal to the band width of such receivers, in order that the entire frequency band can be monitored without any gaps or interspaces. The pulse transmitter 21 always delivers a pulse to the comparator 15 between two staircase steps, so that such comparator compares the signals delivered thereto by the receivers 7 and 8 only between two individual steps and not during the switching steps. If the comparator 15 were not blocked during the shifting of the tuning frequency of the receivers 7 and 8, then during the actual switch-over operation erroneous measurements could arise.

Now in FIG. 3 there is portrayed a block circuit diagram of a preferred exemplary embodiment of apparatus or installation for the detection of a small or miniature transmitter which transmits electro-magnetic oscillations. The most expensive components of the installation of FIG. 2 are the receivers. In the installation of FIG. 2 there is thus only provided one receiver 22 for the purpose of reducing manufacturing costs. The input 22a of this single receiver 22 is connected via a first electronic reversing or switching mechanism 23 with the measurement antennae 24 and 25. The output 22b of the receiver 22 is coupled via a second electronic reversing or switching mechanism 26 with two analog stores or storage devices 27 and 28, the outputs 27a and 28a of which are electrically coupled with a comparator 29.

Since only the receiver 22 is provided, there can be measured at the same time only the field intensity at the location of one or the other measurement antennae 24 and 25. For comparing the measured values it is therefore necessary to store at least the first determined value. In the exemplary embodiment of FIG. 3 it is preferred to store both measurement values in a respective one of the identical storages 27 and 28, whereby the comparison in the comparator 29 can be readily undertaken. If there is only employed one storage, then the signal appearing at the output of the storage must be identical to the signal delivered to its input. The value taken-up by the measurement antenna 25 is stored in the analog storage 27 and the value received by the measurement antenna 24 is stored in the analog storage 28.

Coupled with the output 29a of the comparator 29 is a threshold value detector or monitor 30 which transmits a trigger signal to an evaluation device or mechanism 31 when the difference between the stored measurement values, determined by the comparator 29, exceeds a predetermined value. This response value is preferably adjustable in order to be able to take into account different conditions at different places of use of the installation. Upon the appearance of a trigger signal at the input 31a of the evaluation device 31, the latter generates an alarm signal which is delivered to a suitable alarm indicator, in this case again for instance the indicator lamp 32.

Figure 4:
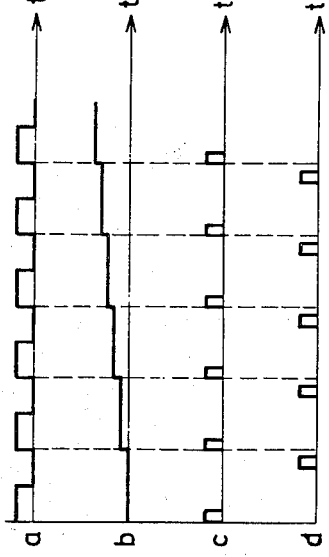
FIG. 4 is a graphic illustration of control signals appearing at different locations of the block circuit diagram of FIG. 3.

The receiver 22 is preferably a source analyzer which can be tuned over a wide range, the receiving frequency of which can be controlled in steps by means of a staircase waveform or voltage, the course of which has been portrayed in line $b$ of the curve of FIG. 4.

The control of the receiving frequency of the receiver 22, the switching of the electronic switching of reversing mechanisms 23 and 26, the extinguishing of the values stored at the analog storages 27 and 28 and the giving of the command for the comparator 29 to carry out the comparison operation, occurs through the agency of a control device or mechanism 36 incorporating a clock generator 33, a staircase voltage generator 34 and a pulse generator 35.

The clock generator 33 generates 0.1 to 400 pulses per second according to the graphic portrayal of line $a$ of FIG. 4. The pulses generated by the clock generator 33 are delivered to the switching mechanisms 23 and 26, the staircase voltage generator 34 and the pulse transmitter 35. The first switching mechanism 23, for instance when there occurs the pulses according to the line $a$ of FIG. 4, switches the measurement antenna 24 so as to be coupled with the receiver 22 and the second switching mechanism 26 connects the output 22b of the receiver 22 with the analog storage 28. During the intervals between the pulses generated by the clock generator 33, the measurement antenna 25 is connected with the input 22a of the receiver 22 and the analog storage 27 with the output 22b of such receiver 22.

Since the staircase waveform, as best seen by referring to line $b$ of FIG. 4, does not change during a pulse and the subsequent pulse interval, there is received by both measurement antennae 24, 25 the same frequency in brief succession and the corresponding values of the field intensity is stored at the relevant analog storages 27 and 28. Shortly prior to termination of the aforementioned pulse interval, the pulse transmitter 35 generates a pulse of the type which has been depicted in line $d$ of FIG. 4. This pulse is delivered as a command to the comparator 29 for carrying out the comparison of the values stored at the analog storages 27 and 28. At the start of each further pulse generated by the clock generator 33, the staircase voltage waveform of the staircase voltage generator 34 is increased by one step and therefore the tuning frequency of the receiver 22 is correspondingly varied. The pulse transmitter 35 always generates at the start of each pulse produced by the clock generator 33 an extinguishing pulse, as indicated in line $c$ of FIG. 4, which is delivered via the lines or conductors 51 to the analog storages 27 and 28. This extinguishing pulse brings about that after carrying out a comparison operation at the comparator 29 the values which have been stored at the analog storages 27 and 28 will be extinguished, so that such storages are prepared for receiving the next values to be measured at a frequency which has been shifted by a small increment or step.

Trials have shown that with a pulse frequency of the clock generator 33 of 200 pulses per second there can be obtained very good results. As a result, there is stepwise or incrementally changed 100 times per second the tuning of the receiver 22 and the time for passing through the entire frequency range which is to be monitored can be maintained within acceptable limits. When there has been reached the end of the frequency range, then the staircase waveform voltage again drops to null, in order to again increase in steps or increments to the maximum value.

The alarm signal generated by the evaluation device 31 can be delivered to the staircase voltage generator 34 in order to prevent that the staircase waveform will further increase. In this manner it is then possible to determine the duration of the activity of the miniature transmitter. After the detected miniature transmitter has stopped its activity, the alarm signal disappears and the apparatus automatically continues its detection function.

In the event that the evaluation device or circuit 31 possesses a recording device, such as the recorder 50 shown schematically in FIG. 2, then it is possible to plot the time for the start of the alarm and also the operating or work frequency of the miniature transmitter. To this end it is necessary that the staircase waveform is likewise delivered via the phantom-line depicted conductor or line 37 to the evaluation device.

This embodiment possesses the advantage that the detection or locating activity of the equipment is not interrupted, since after having undertaken the plotting of the above-mentioned data, it is possible to proceed with the detection of still further miniature transmitters.

In the case of an installation which is equipped with a number of measurement antennae for monitoring a number of spaces or rooms, it is advantageous to use an auxiliary device, which has not been particularly illustrated, in order to shorten the throughpassage time of the measurements for all of the rooms to be monitored to the absolute necessary amount of time. Such auxiliary device encompasses a microphone and a circuit which is erected in each of these rooms, and which only then delivers a signal when a conversation is going on at the corresponding room with which the circuit is associated. These signals are delivered to a third switching mechanism for the switching of the measurement antennae at the different rooms. On the basis of such signals this third switching mechanism only then successively switches those measurement antennae via the first switching mechanism 23 with the input of the receiver 22 at which there is just taking place a conversation or where shortly prior a conversation had been taking place.

With the above-described installation it is possible to detect whether in a room or space to be monitored there is in operation or not a source for an electro-magnetic field, for instance an illegal miniature transmitter. A further notable advantage of this installation is the fact that the monitoring operation can be carried out automatically.

In the event that a number of spaces or rooms are to be monitored, then the number of measurement antennae is increased in accordance with the number of additional rooms to be monitored. For this purpose there is incorporated between the room antennae and the switching mechanism 23 a further non-illustrated electronic switching mechanism which, after passing through each frequency band of the receiver 22, switches from one measurement antenna to the other.

While there is shown and described present preferred embodiments of the invention, it is to be distinctly understood that the invention is not limited thereto, but may be otherwise variously embodied and practiced within the scope of the following claims. Accordingly, What is claimed is:

1. A method for detecting the presence of an unauthorized concealed source of electromagnetic energy comprising the steps of:
    suspecting a location of a concealed source of electromagnetic energy;
    receiving at a first location adjacent the suspected location of said concealed source the electromagnetic energy from said source;
    measuring the magnitude of the field intensity of the electromagnetic energy of said source received at the first location;
    randomly selecting a second location spatially separated from the first location;
    receiving at the randomly selected second location the electromagnetic energy from said source;
    measuring the magnitude of the field intensity of the electromagnetic energy of said source received at the second location;
    detecting the difference between the field intensity magnitude measured at the first location and the field intensity magnitude measured at the second location; and
    triggering an indication when the difference between the magnitudes of field intensities exceeds a predetermined magnitude greater than zero.

2. The method according to claim 1 wherein the receiving steps are successively performed and including the step of storing the field intensity magnitudes measured at the first and second locations.

3. The method according to claim 1 wherein the receiving steps are simultaneously performed.

4. A method for detecting the presence of an unauthorized concealed first source of electromagnetic energy located within a building and transmitting at an operating frequency having an associated frequency band of emission in the presence of an interfering second source of electromagnetic energy positioned at a distant external location from said building and transmitting at a frequency such that at least some of the electromagnetic energy transmitted by said second source is within said frequency band of emission of said first source, comprising the steps of:
    suspecting a location of said concealed first source of electromagnetic energy within said building;
    receiving the electromagnetic energy emanating from said first and second sources in said frequency band of emission at a first location within said building adjacent the suspected location of said source;
    measuring the magnitude of the sum of the field intensities of the electromagnetic energy received from said first and second sources in said frequency band of emission at the first location;
    randomly selecting a second location spatially separated from the first location;
    receiving the electromagnetic energy emanating from said first and second sources in said frequency band of emission at the second randomly selected location within said building;
    measuring the magnitude of the sum of the field intensities of the electromagnetic energy received from said first and second sources in said frequency band of emission at the second location;
    detecting the difference between the sum of the field intensity magnitudes measured at the first location and the sum of the field intensity magnitudes measured at the second location; and
    triggering an indication when said difference exceeds a predetermined magnitude greater than zero.

5. The method according to claim 4 wherein the receiving steps are successively performed and including the step of storing the field intensity magnitudes measured at the first and second locations.

6. The method according to claim 4 wherein the receiving steps are simultaneously performed.

7. A system for detecting the presence of an unauthorized concealed source of electromagnetic energy within a building comprising:
    at least two receiving antennae positioned within said building at separate locations of random spacing therebetween, each antenna having an output, at least one of said antennae being positioned adjacent a suspected location of said concealed source;
    tunable receiving means adapted to selectively connected to the output of each of said receiving antennae for receiving and measuring the magnitude of field intensity of the electromagnetic energy of said source received by each of said receiving antennae, said tunable receiver means having an output proportional to the magnitude of field intensity of the electromagnetic energy of said source received by said antennae;
    means for selectively connecting the output of each of said receiving antennae to said tunable receiver means;
    storage means connected to the output of said receiver means for separately storing the magnitude of field intensity of the electromagnetic energy of said source received by each of said receiving antennae and measured by said receiver means;
    means connected to said storage means for detecting the difference between the stored magnitude of field intensity of the electromagnetic energy of said source received by one of said receiving antennae and the stored magnitude of field intensity of the electromagnetic energy of said source received by another of said receiving antennae, said detection means having an output proportional to said difference;
    means connected to said detection means output for generating a trigger signal when the output of said detection means exceeds a predetermined magnitude greater than zero; and
    indicator means connected to said signal generating means and responsive to said trigger signal for indicating that said predetermined magnitude has been exceeded.

8. The system according to claim 7 wherein each of said receiving antennae is substantially omnidirectional.

9. The system according to claim 7 wherein said means for selectively connecting said receiver means to each of said receiving antennae includes switching means.

10. The system according to claim 7 wherein the receiving frequency of said receiver means is voltage tunable over a frequency range by a staircase voltage and including a staircase voltage generator connected to said receiver means for shifting the receiving frequency of said receiver means.

11. The system according to claim 10 including a clock generator means connected to said staircase voltage generator for generating a timing pulse for controlling the staircase voltage pulse interval of said staircase voltage generator.

12. A system for detecting the presence of an unauthorized concealed source of electromagnetic energy within a building comprising:
    first and second switching antennae positioned within said building at separate locations of random spacing therebetween, each antenna having an output, said first antenna being positioned adjacent a suspected location of said concealed source;
    first and second tunable receiver means associated with said antennae, and connected to the outputs of said first and second receiving antennae respectively for receiving and measuring the magnitude of field intensity of the electromagnetic energy of said source received by said first and second receiving antennae respectively;
    means connected to the outputs of said first and second receiver means for detecting the difference between the magnitude of field intensity of the electromagnetic energy of said source received by said first antenna and the magnitude of field intensity of the electromagnetic energy of said source received by said second antenna, said detection means having an output proportional to said difference;
    means connected to the output of said detection means for generating a trigger signal when said detection means output exceeds a predetermined magnitude greater than zero; and
    indication means connected to said signal generating means and responsive to said trigger signal for indicating that said predetermined magnitude has been exceeded.

13. The system according to claim 12 wherein each of said receiving antennae is substantially omnidirectional.

14. The system according to claim 12 including tuning means connected to each of said receiver means for simultaneously shifting the receiving frequency of each of said receiver means.

* * * * *